(12) United States Patent
Zhang et al.

(10) Patent No.: US 10,847,101 B2
(45) Date of Patent: Nov. 24, 2020

(54) GATE DRIVER CIRCUIT AND LIQUID CRYSTAL PANEL USING SAME

(71) Applicant: Wuhan China Star Optoelectronics Technology Co., Ltd., Wuhan (CN)

(72) Inventors: Xin Zhang, Wuhan (CN); Juncheng Xiao, Wuhan (CN); Yanqing Guan, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/472,900

(22) PCT Filed: Jan. 3, 2019

(86) PCT No.: PCT/CN2019/070208
§ 371 (c)(1),
(2) Date: Jun. 24, 2019

(87) PCT Pub. No.: WO2020/107643
PCT Pub. Date: Jun. 4, 2020

(65) Prior Publication Data
US 2020/0168168 A1    May 28, 2020

(30) Foreign Application Priority Data
Nov. 28, 2018 (CN) .......................... 2018 1 1430501

(51) Int. Cl.
*G09G 3/36* (2006.01)
*G11C 19/18* (2006.01)
*G11C 19/28* (2006.01)

(52) U.S. Cl.
CPC .......... *G09G 3/3611* (2013.01); *G11C 19/184* (2013.01); *G11C 19/28* (2013.01); *G09G 2310/0286* (2013.01)

(58) Field of Classification Search
USPC ........................................................ 345/100
See application file for complete search history.

(56) References Cited

U.S. PATENT DOCUMENTS

2016/0189649 A1* 6/2016 Xiao ................... G09G 3/3677
345/214

\* cited by examiner

*Primary Examiner* — Deeprose Subedi (57) ABSTRACT

A gate driver circuit and a liquid crystal panel using the same are provided. The gate driver circuit includes a forward/reverse switching module, a low electrical potential line, and a synchronization module. The forward/reverse switching module includes an up to down terminal and a down to up terminal. The synchronization module is configured to electrically conduct the low electrical potential line with one of the up to down terminal and the down to up terminal which has a lower electrical potential.

17 Claims, 6 Drawing Sheets

GATE DRIVER CIRCUIT AND LIQUID CRYSTAL PANEL USING SAME

RELATED APPLICATIONS

This application is a National Phase of PCT Patent Application No. PCT/CN2019/070208 having International filing date of Jan. 3, 2019, which claims the benefit of priority of Chinese Patent Application No. 201811430501.8 filed on Nov. 28, 2018. The contents of the above applications are all incorporated by reference as if fully set forth herein in their entirety.

FIELD AND BACKGROUND OF THE INVENTION

The present disclosure relates to driving circuit technologies, and more particularly, to a gate driver circuit and a liquid crystal panel using the same.

Figure 1:
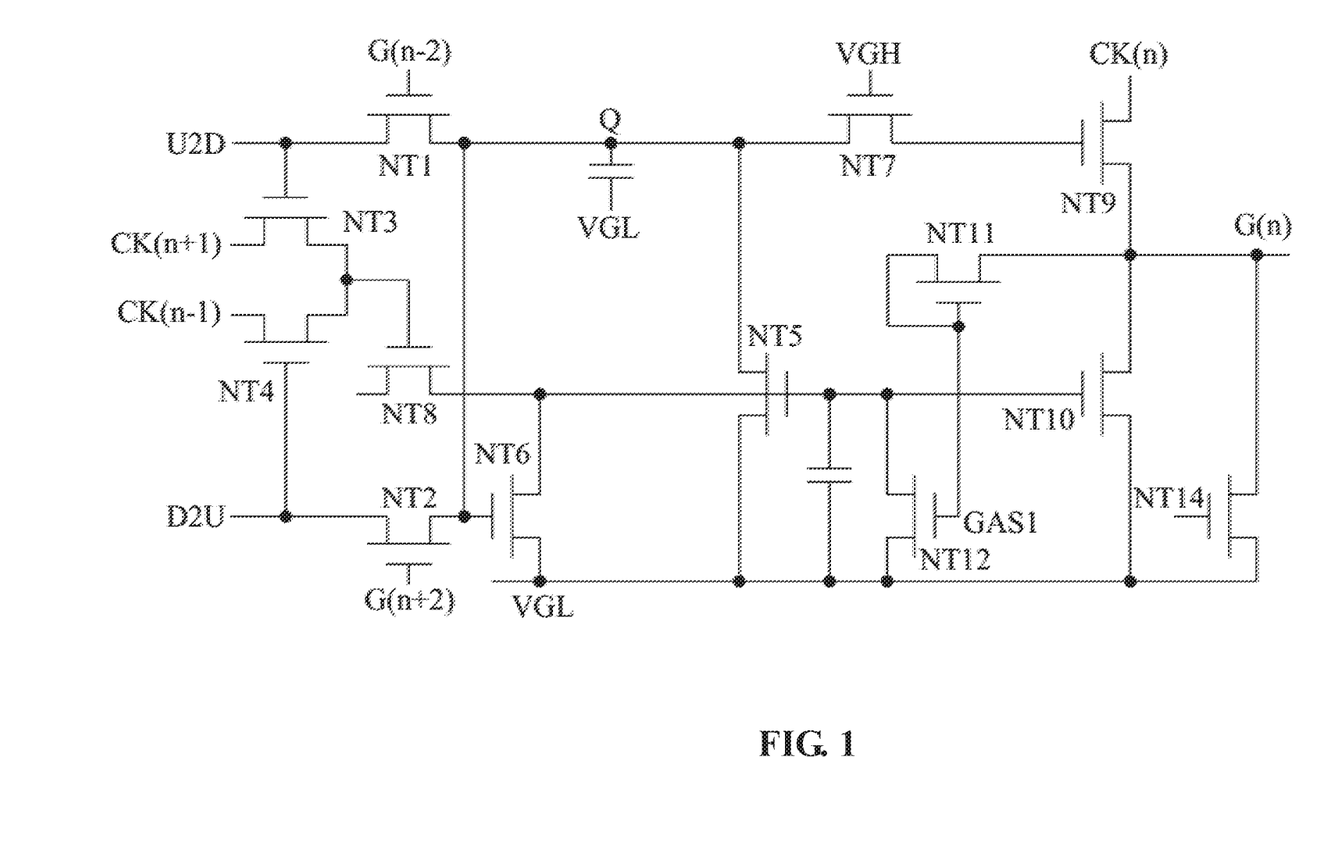
FIG. 1 is a schematic view of a structure of a gate driver circuit of prior art.
Figure 2:
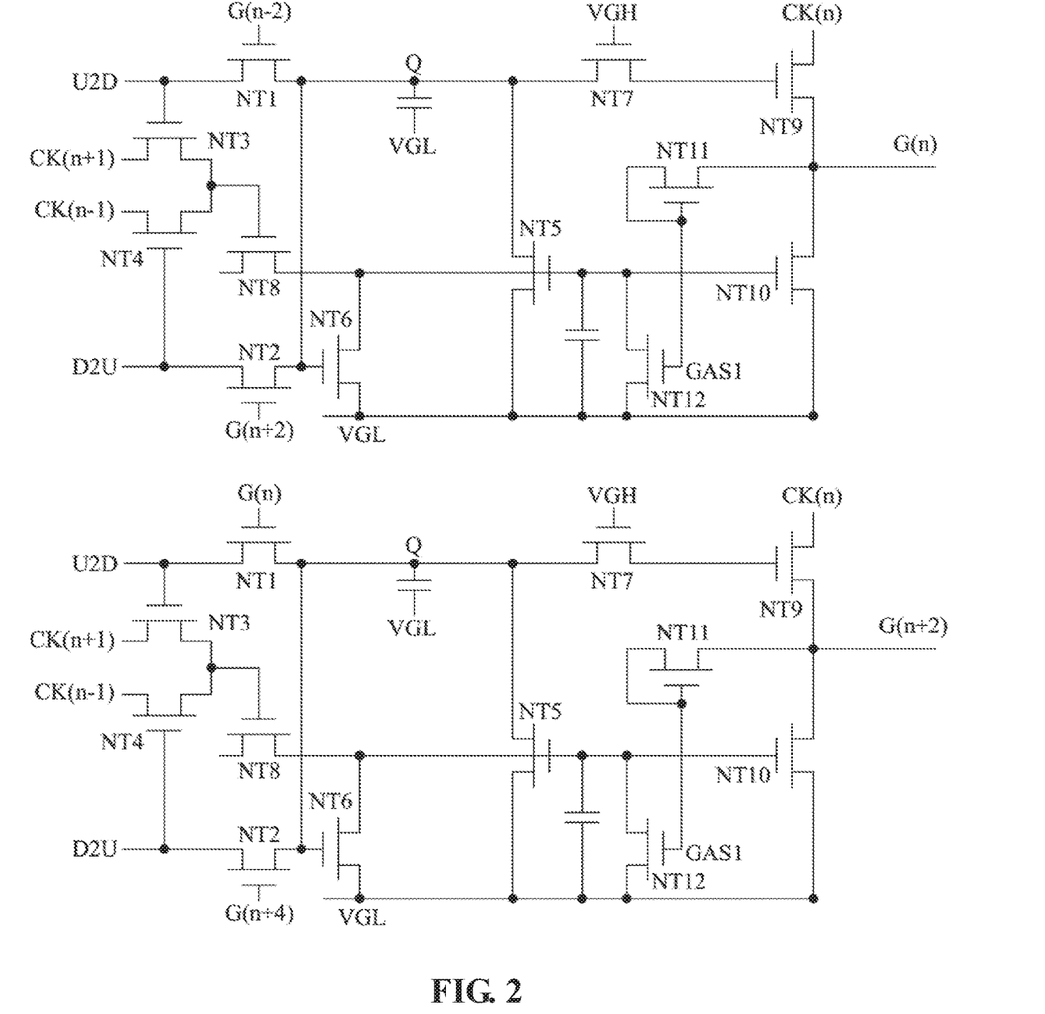
FIG. 2 is a schematic view of a structure of a gate driver circuit with four clock signals of prior art.
Figure 3:
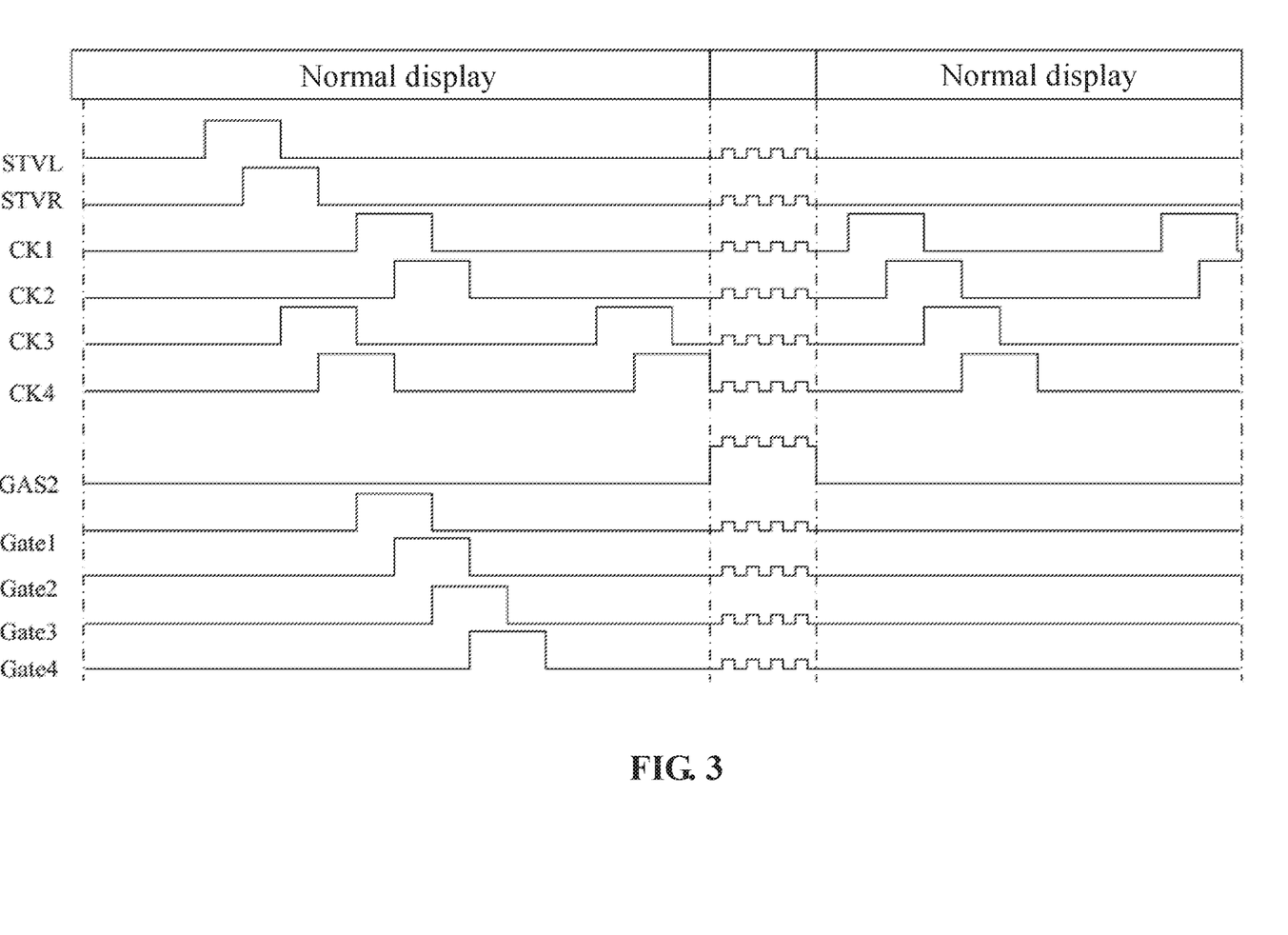
FIG. 3 is a schematic view of a time diagram of the circuit in FIG. 2.

At present, liquid crystal display devices have been widely used as display components of electronic devices in various electronic products, and gate driver on array (GOA) circuits are important components of liquid crystal display devices. GOAs are gate driving circuits on array substrates manufacturing by thin-film transistor processes of existing liquid crystal displays to realize a driving method that scans gates of pixel arrays row by row. FIGS. 1 and 2 show a conventional gate driver circuit, and FIG. 3 is a time diagram of a circuit of FIG. 2.

In conventional GOA circuits, it can be classified into n-channel metal oxide semiconductor (NMOS) circuits, p-channel metal oxide semiconductor (PMOS) circuits, and complementary metal oxide semiconductor (CMOS) circuits. Comparing with the CMOS circuits, the NMOS circuits omit a process of P-doping and omit photomasks using thereof to improve the yield and reduce the cost.

Comparing with CMOS GOA circuits, stability of single-type NMOS or PMOS GOA circuits is easily interfered by a display area, especially when the display device is displaying reloaded images (pixels inversion, etc.). It easily causes the GOA circuits to fail, especially in a middle or large size horizontal screen.

China patent No. CN105261343B discloses a GOA circuit including a plurality of stages of GOA modules. Each stage of the GOA modules includes a first driving unit, a second driving unit, and a waking up driving unit. The first driving unit is configured to output a row scanning signal during row scanning. The second driving unit having an output end electrically connected to an output end of the first driving unit is configured to maintain an output signal of the output end during row scanning, and to output a scanning signal corresponding to a touch scanning signal during touch scanning. A waking up unit is configured to control each stage of the driver modules output valid row signals simultaneously when a display panel is waking up from a black screen state. The GOA circuit can effectively eliminate unstable factors in the circuit and reduce risks of function failure of the circuit. However, it cannot solve the problem that stability of single-type GOAs are easily disturbed by the display area, especially in the case of the reloaded images (images such as pixels inversion), which easily causes the GOAs to fail.

Therefore, there is a need for a display panel to solve the above problems.

SUMMARY OF THE INVENTION

In view of the above, the present disclosure provides a gate driver circuit and a liquid crystal panel using the same to resolve above-mentioned technical problem.

In order to achieve above-mentioned object of the present disclosure, one embodiment of the disclosure provides a gate driver circuit for a liquid crystal panel including a plurality of shift registers. Each of the plurality of shift registers includes a forward/reverse switching module, a low electrical potential line, and a synchronization module. The forward/reverse switching module includes an up to down terminal and a down to up terminal. The forward/reverse switching module is configured to control a scan order of the plurality of shift registers by a signal from the up to down terminal and a signal from the down to up terminal. The synchronization module is configured to electrically conduct the low electrical potential line with one of the up to down terminal and the down to up terminal which has a lower electrical potential. Each of the plurality of shift registers further includes a gate signal terminal, a pull-up module, a pull-up switch, a pull-down module, and a pull-down switch. The pull-up module is configured to receive a gate signal from a previous shift register and to produce a pull-up signal. The pull-up switch is electrically connected to the pull-up module and the gate signal terminal and is configured to receive the pull-up signal and a clock signal and configured to transmit the clock signal to the gate signal terminal according to the pull-up signal. The pull-down module is configured to receive a gate signal from a next shift register and to produce a pull-down signal. The pull-down switch is electrically connected to the pull-down module, the gate signal terminal, and the low electrical potential line and is configured to receive the pull-down signal and configured to electrically conduct the gate signal terminal and the low electrical potential line according to the pull-down signal. The forward/reverse switching module is electrically connected to the pull-up module and the pull-down module and is configured to control the pull-up module and the pull-down module according to a signal from the up to down terminal and a signal from the down to up terminal.

In one embodiment of the disclosure, the synchronization module includes a first thin film transistor and a second thin film transistor. A gate of the first thin film transistor is electrically connected to the up to down terminal. A source of the first thin film transistor is electrically connected to the low electrical potential line. A drain of the first thin film transistor is electrically connected to the down to up terminal. A gate of the second thin film transistor is electrically connected to the down to up terminal. A source of the second thin film transistor is electrically connected to the up to down terminal. A drain of the second thin film transistor is electrically connected to the low electrical potential line.

In one embodiment of the disclosure, the gate driver circuit further includes an all gate off module electrically connected to the gate signal terminal and the low electrical potential line.

In one embodiment of the disclosure, the gate driver circuit further includes an all gate on module electrically connected to the gate signal terminal, the pull-down switch, and the low electrical potential line.

In one embodiment of the disclosure, the gate driver circuit for a liquid crystal panel is a gate driver on array (GOA) circuit.

In one embodiment of the disclosure, the first thin film transistor and the second thin film transistor are both N-channel metal oxide semiconductors (NMOSs).

Furthermore, another embodiment of the disclosure provides a gate driver circuit for a liquid crystal panel including a plurality of shift registers. Each of the plurality of shift registers includes a forward/reverse switching module, a low electrical potential line, and a synchronization module. The forward/reverse switching module includes an up to down terminal and a down to up terminal. The forward/reverse switching module is configured to control a scan order of the plurality of shift registers by a signal from the up to down terminal and a signal from the down to up terminal. The synchronization module is configured to electrically conduct the low electrical potential line with one of the up to down terminal and the down to up terminal which has a lower electrical potential.

In one embodiment of the disclosure, each of the plurality of shift registers further includes a gate signal terminal, a pull-up module, a pull-up switch, a pull-down module, and a pull-down switch. The pull-up module is configured to receive a gate signal from a previous shift register and to produce a pull-up signal. The pull-up switch is electrically connected to the pull-up module and the gate signal terminal and is configured to receive the pull-up signal and a clock signal and configured to transmit the clock signal to the gate signal terminal according to the pull-up signal. The pull-down module is configured to receive a gate signal from a next shift register and to produce a pull-down signal. The pull-down switch is electrically connected to the pull-down module, the gate signal terminal, and the low electrical potential line and is configured to receive the pull-down signal and configured to electrically conduct the gate signal terminal and the low electrical potential line according to the pull-down signal. The forward/reverse switching module is electrically connected to the pull-up module and the pull-down module and is configured to control the pull-up module and the pull-down module according to a signal from the up to down terminal and a signal from the down to up terminal.

In one embodiment of the disclosure, the synchronization module includes a first thin film transistor and a second thin film transistor. A gate of the first thin film transistor is electrically connected to the up to down terminal. A source of the first thin film transistor is electrically connected to the low electrical potential line. A drain of the first thin film transistor is electrically connected to the down to up terminal. A gate of the second thin film transistor is electrically connected to the down to up terminal. A source of the second thin film transistor is electrically connected to the up to down terminal. A drain of the second thin film transistor is electrically connected to the low electrical potential line.

In one embodiment of the disclosure, the gate driver circuit further includes an all gate off module electrically connected to the gate signal terminal, and the low electrical potential line.

In one embodiment of the disclosure, the gate driver circuit further includes an all gate on module electrically connected to the gate signal terminal, the pull-down switch, and the low electrical potential line.

In one embodiment of the disclosure, the gate driver circuit for a liquid crystal panel is a GOA circuit.

In one embodiment of the disclosure, the first thin film transistor and the second thin film transistor are both NMOSs.

Furthermore, another embodiment of the disclosure provides a liquid crystal panel including a substrate, a pixel array, a gate driver circuit, and a clock signal producer. All of the pixel array, the gate driver circuit and the clock signal producer are disposed on the substrate. The gate driver circuit is configured to drive the pixel array. The clock signal producer is configured to produce a clock signal to the gate driver circuit. The gate driver circuit including a plurality of shift registers. Each of the plurality of shift registers includes a forward/reverse switching module, a low electrical potential line, and a synchronization module. The forward/reverse switching module includes an up to down terminal and a down to up terminal. The forward/reverse switching module is configured to control a scan order of the plurality of shift registers by a signal from the up to down terminal and a signal from the down to up terminal. The synchronization module is configured to electrically conduct the low electrical potential line with one of the up to down terminal and the down to up terminal which has a lower electrical potential.

In one embodiment of the disclosure, each of the plurality of shift registers further includes a gate signal terminal, a pull-up module, a pull-up switch, a pull-down module, and a pull-down switch. The pull-up module is configured to receive a gate signal from a previous shift register and to produce a pull-up signal. The pull-up switch is electrically connected to the pull-up module and the gate signal terminal and is configured to receive the pull-up signal and a clock signal and configured to transmit the clock signal to the gate signal terminal according to the pull-up signal. The pull-down module is configured to receive a gate signal from a next shift register and to produce a pull-down signal. The pull-down switch is electrically connected to the pull-down module, the gate signal terminal, and the low electrical potential line and is configured to receive the pull-down signal and configured to electrically conduct the gate signal terminal and the low electrical potential line according to the pull-down signal. The forward/reverse switching module is electrically connected to the pull-up module and the pull-down module and is configured to control the pull-up module and the pull-down module according to a signal from the up to down terminal and a signal from the down to up terminal.

In one embodiment of the disclosure, the synchronization module includes a first thin film transistor and a second thin film transistor. A gate of the first thin film transistor is electrically connected to the up to down terminal. A source of the first thin film transistor is electrically connected to the low electrical potential line. A drain of the first thin film transistor is electrically connected to the down to up terminal, a gate of the second thin film transistor is electrically connected to the down to up terminal. A source of the second thin film transistor is electrically connected to the up to down terminal. A drain of the second thin film transistor is electrically connected to the low electrical potential line.

In one embodiment of the disclosure, the gate driver circuit further includes an all gate off module electrically connected to the gate signal terminal, and the low electrical potential line.

In one embodiment of the disclosure, the gate driver circuit further includes an all gate on module electrically connected to the gate signal terminal, the pull-down switch, and the low electrical potential line.

In one embodiment of the disclosure, the gate driver circuit for a liquid crystal panel is a GOA circuit.

In one embodiment of the disclosure, the first thin film transistor and the second thin film transistor are both NMOSs.

In comparison with prior art, the single-type gate driver circuit and the liquid crystal panel of the embodiments of the disclosure realize a driving method that scans the gates of pixel arrays row by row. The embodiments of the disclosure enhance stability of the single-type gate driver circuit when the display device is displaying reloaded images by the synchronization module. The embodiments of the disclosure prevent the stability of the gate driver circuit from being interfered by the display area and reduce risks of reloading failure of the gate driver circuit by means of synchronizing the disturbance of the down to up terminal with the low electrical potential line or synchronizing the disturbance of the up to down terminal with the low electrical potential line.

DESCRIPTION OF SPECIFIC EMBODIMENTS OF THE INVENTION

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 4:
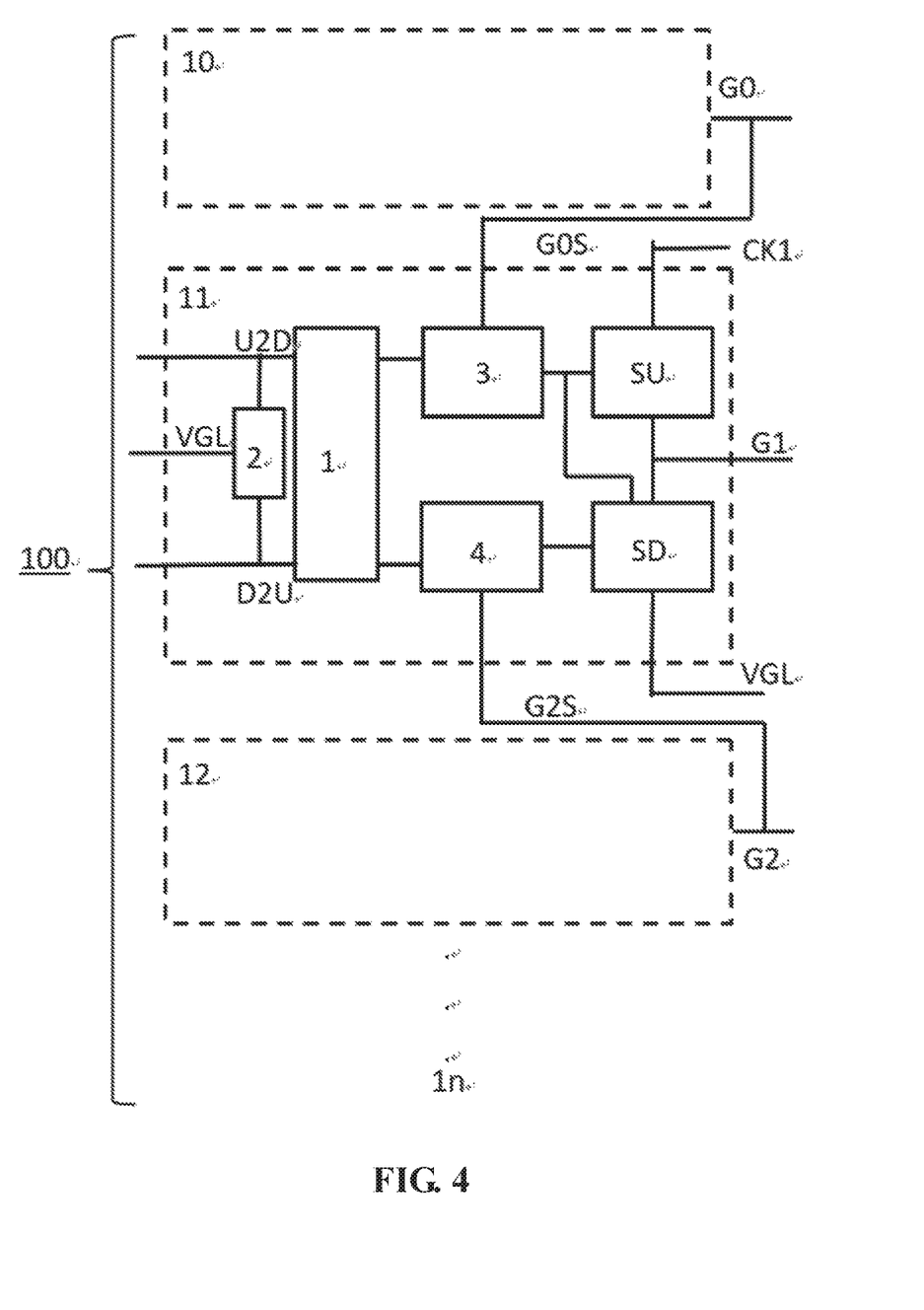
FIG. 4 is a schematic block structural view of a gate driver circuit according to an embodiment of the disclosure.

Referring to FIG. 4, FIG. 4 is a schematic block structural view of a gate driver on array (GOA) circuit according to an embodiment of the disclosure.

One embodiment of the disclosure provides a gate driver circuit 100 for a liquid crystal panel including a plurality of shift registers 10, 11, . . . , 1n. Taking the shift register 11 as an example, each of the plurality of shift registers includes a forward/reverse switching module 1, a low electrical potential line VGL, and a synchronization module 2. The forward/reverse switching module 1 includes an up to down terminal U2D and a down to up terminal D2U. The forward/reverse switching module 1 is configured to control a scan order of the plurality of shift registers 10, 11, . . . , 1n by a signal from the up to down terminal U2D and a signal from the down to up terminal D2U. The synchronization module 2 is configured to electrically conduct the low electrical potential line VGL with one of the up to down terminal U2D and the down to up D2U terminal which has a lower electrical potential.

In one embodiment of the gate driver circuit 100 of the disclosure provides, taking the shift register 11 as an example, each of the plurality of shift registers further includes a gate signal terminal G1, a pull-up module 3, a pull-up switch SU, a pull-down module 4, and a pull-down switch SD. The pull-up module 3 is configured to receive a gate signal GOS from a previous shift register 10 and to produce a pull-up signal. The pull-up switch SU is electrically connected to the pull-up module 3 and the gate signal terminal G1 and is configured to receive the pull-up signal and a clock signal CK1 and configured to transmit the clock signal CK1 to the gate signal terminal G1 according to the pull-up signal. The pull-down module 4 is configured to receive a gate signal G2S from a next shift register 12 and to produce a pull-down signal. The pull-down switch SD is electrically connected to the pull-down module 4, the gate signal terminal G1, and the low electrical potential line VGL, and is configured to receive the pull-down signal and configured to electrically conduct the gate signal terminal G1 and the low electrical potential line VGL according to the pull-down signal. The forward/reverse switching module 1 is electrically connected to the pull-up module 3 and the pull-down module 4, and is configured to control the pull-up module 3 and the pull-down module 4 according to a signal from the up to down terminal U2D and a signal from the down to up terminal D2U.

Figure 5:
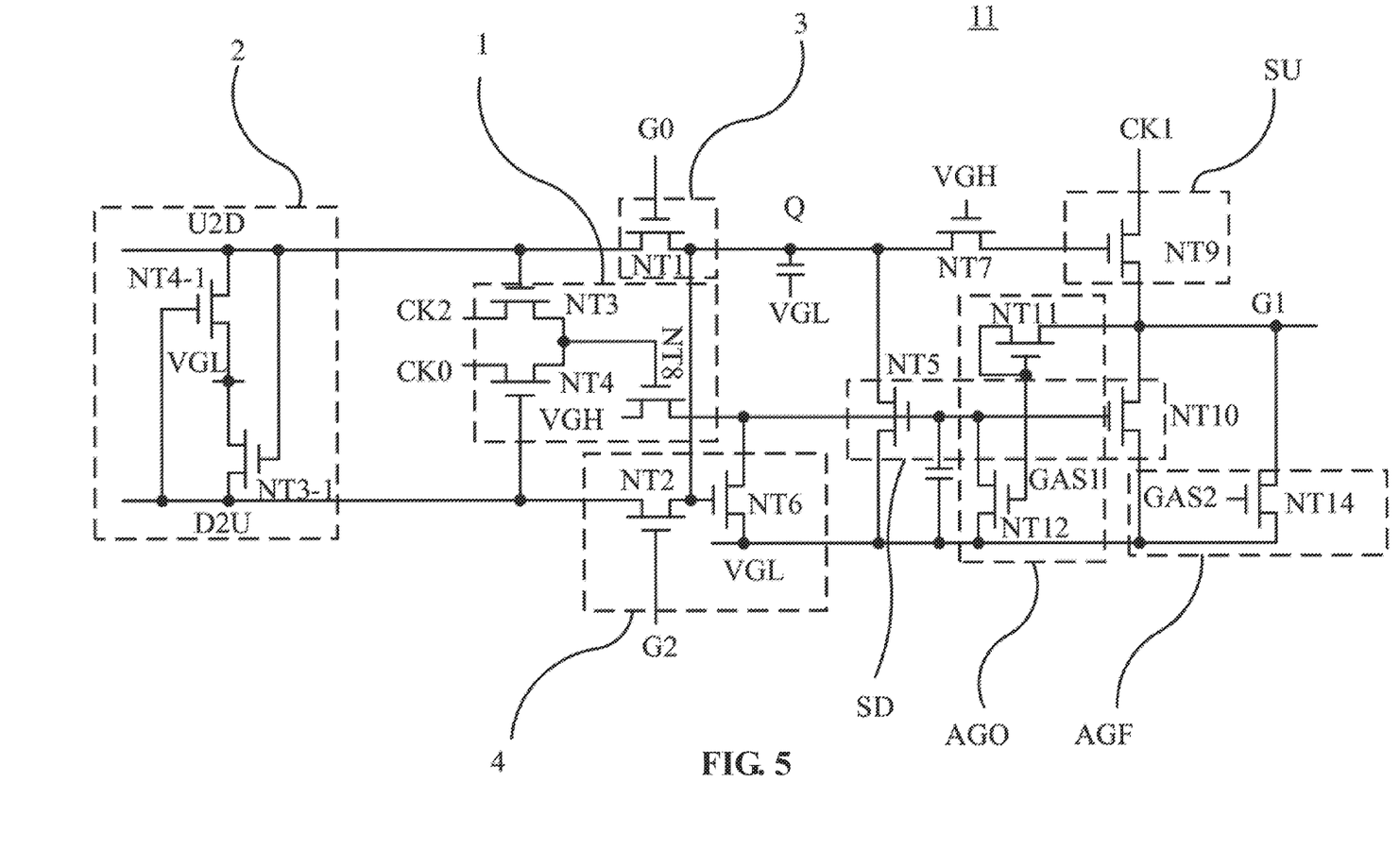
FIG. 5 is a schematic view of a structure of an embodiment of a shift register of a gate driver circuit according to an embodiment of the disclosure.

The basic components of the GOA circuits illustrated in FIG. 4 and FIG. 5 are only embodiments of the disclosure, and the disclosure is not limited thereto. The circuit of the shift register may also use other technique such as interlace driving or a bilateral array substrate line driving circuit. The 4-clock pulse GOA circuits illustrated in FIG. 5 can also be adaptively adjusted to a 6-clock pulse GOA circuits or an 8-clock pulse GOA circuits, and the disclosure is not limited thereto.

Referring to FIG. 5, FIG. 5 is a schematic view of a structure of an embodiment of a shift register of a GOA circuit according to an embodiment of the disclosure.

Taking the shift register 11 as an example, in one embodiment of the disclosure, the synchronization module 2 includes a first thin film transistor NT3-1 and a second thin film transistor NT4-1. A gate of the first thin film transistor NT3-1 is electrically connected to the up to down terminal U2D. A source of the first thin film transistor NT3-1 is electrically connected to the low electrical potential line VGL. A drain of the first thin film transistor NT3-1 is electrically connected to the down to up terminal D2U. A gate of the second thin film transistor NT4-1 is electrically connected to the down to up terminal D2U. A source of the second thin film transistor NT4-1 is electrically connected to the up to down terminal U2D. A drain of the second thin film transistor NT4-1 is electrically connected to the low electrical potential line VGL.

Taking the shift register 11 as an example, in one embodiment of the disclosure, the shift register of the gate driver circuit further includes an all gate off module AGF electrically connected to the gate signal terminal G1 and the low electrical potential line VGL.

Taking the shift register 11 as an example, in one embodiment of the disclosure, the shift register of the gate driver circuit further includes an all gate on module AGO electrically connected to the gate signal terminal G1, the pull-down switch SD (NT10), and the low electrical potential line VGL.

In one embodiment of the disclosure, the gate driver circuit for a liquid crystal panel is a GOA circuit.

In one embodiment of the disclosure, the first thin film transistor and the second thin film transistor are both N-channel metal oxide semiconductors (NMOSs).

Furthermore, another embodiment of the disclosure provides a liquid crystal panel.

Figure 6:
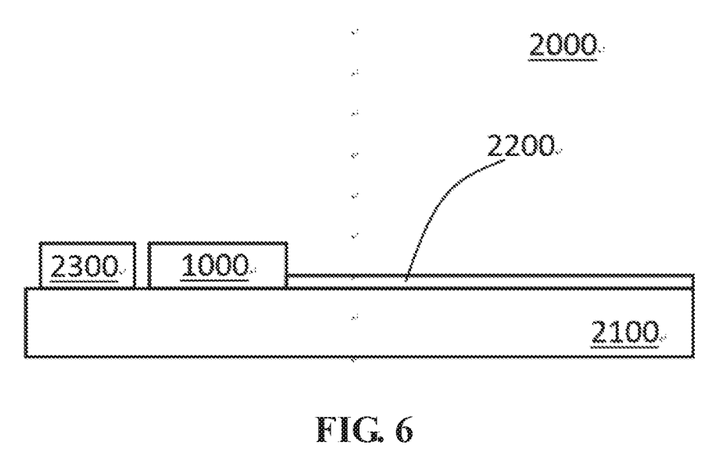
FIG. 6 is a schematic view of a structure of a liquid crystal panel according to an embodiment of the disclosure.

Referring to FIGS. 6 and 4, FIG. 6 is a schematic view of a structure of a liquid crystal panel according to an embodiment of the disclosure.

An embodiment of the liquid crystal panel 2000 of the disclosure including a substrate 2100, a pixel array 2200, a gate driver circuit 1000, and a clock signal producer 2300. All of the pixel array 2200, the gate driver circuit 1000 and the clock signal producer 2300 are disposed on the substrate 2100. The gate driver circuit 1000 is configured to drive the pixel array 2200. The clock signal producer 2300 is configured to produce a clock signal to the gate driver circuit 1000. The gate driver circuit 1000 includes a plurality of shift registers 10, 11, . . . , 1n. Taking the shift register 11 as an example, each of the plurality of shift registers includes a forward/reverse switching module 1, a low electrical potential line VGL, and a synchronization module 2. The forward/reverse switching module 1 includes an up to down terminal U2D and a down to up terminal D2U. The forward/reverse switching module 1 is configured to control a scan order of the plurality of shift registers 10, 11, . . . , 1n by a signal from the up to down terminal U2D and a signal from the down to up terminal D2U. The synchronization module 2 is configured to electrically conduct the low electrical potential line VGL with one of the up to down terminal U2D and the down to up terminal D2U which has a lower electrical potential.

Referring to FIG. 5, the pull-up switch SU includes a thin film transistor NT9, and the pull-down switch SD includes thin film transistors NT5 and NT10. The thin film transistor NT5 is used to turn off the thin film transistor NT9. The thin film transistor NT10 is used to pull the voltage level of the gate signal terminal G1 to be the same as the voltage level of the low electrical potential line VGL.

An embodiment of the forward/reverse switching module 1 includes three thin film transistors NT3, NT4, and NT8. A gate of the thin film transistor NT3 is electrically connected to the up to down terminal U2D. A source of the thin film transistor NT3 is electrically connected to a clock signal CK3. A gate of the thin film transistor NT4 is electrically connected to the down to upper terminal D2U. A source of the thin film transistor NT4 is electrically connected to a clock signal CK0. All drains of the thin film transistors NT3 and NT4 are electrically connected to a gate of the thin film transistor NT8. A source of the thin film transistor NT8 is electrically connected to the high electrical potential line VGH. A drain of the thin film transistor NT8 is electrically connected to the thin film transistors NT5 and NT10 of the pull-down switch SD to control the thin film transistors NT5 and NT10.

The pull-up module 3 includes a thin film transistor NT1, and the pull-down module 4 includes thin film transistors NT2 and NT6.

The all gate off module AGF includes a thin film transistor NT14. A source of the thin film transistor NT14 is electrically connected to the gate signal terminal G1. A drain of the thin film transistor NT14 is electrically connected to the low electrical potential line VGL.

The all gate on module AGO includes thin film transistors NT11 and NT12. A drain of the thin film transistor NT11 is electrically connected to the gate signal terminal G1. A source of the thin film transistor NT12 is electrically connected to the pull-down switch SD. A drain of the thin film transistor NT12 is electrically connected to the low electrical potential line VGL.

In a forward scan mode, an electrical potential of the up to down terminal U2D is high, and an electrical potential of the down to up terminal D2U is low. Therefore, the first thin film transistor NT3-1 in the synchronization module 2 is on. The down to up terminal D2U and the low electrical potential line VGL are electrical conduction through the first thin film transistor NT3-1. So that a disturbance of the down to up terminal D2U is synchronized with a disturbance of the low electrical potential line VGL, which reduces risks of reloading failure of the GOA circuits.

In a reverse scan mode, the electrical potential of the up to down terminal U2D is low, and the electrical potential of the down to up terminal D2U is high, therefore, the second thin film transistor NT4-1 in the synchronization module 2 is on. The up to down terminal U2D and the low electrical potential line VGL are electrical conduction through the second thin film transistor NT4-1. So that a disturbance of the up to down terminal U2D is synchronized with a disturbance of the low electrical potential line VGL, which reduces the risks of reloading failure of the GOA circuits.

When reloading images, the pixel array of the display area is electrically connected to the low electrical potential line VGL through the thin film transistor NT10. The low electrical potential line VGL is most affected by a coupling of a display area signal. A signal fluctuation of the low electrical potential line VGL is greater than a signal fluctuation of the down to up terminal D2U. Although an electrical potential of the low electrical potential line VGL is theoretically the same as the electrical potential of the down to up terminal D2U, the low electrical potential line VGL is actually affected by the display area signal. The coupling and the influence of the display area signal make transient voltage of the low electrical potential line VGL higher than the down to up terminal D2U. A gate of the thin film transistor NT2 in the pull-down module 4 is electrically connected to the gate signal terminal G2 of the next stage shift register. The next stage shift register should be kept off when the shift register of this stage is turned on. Therefore, its gate signal terminal G2 is electrically connected to the low electrical potential line VGL through its thin film transistor NT10. When the transient voltage of the low electrical potential line VGL is disturbed, the thin film transistor NT2 of the present stage has a risk of being instantaneously turned on. If the thin film transistor NT2 is turned on, there is a risk that the electrical potential at Q point is released, and the high electrical potential at Q point cannot be maintained. When the shift register of this stage is turned on, the Q point should maintain its high electrical potential to turn on the thin film transistor NT9 of the pull-up switch SU, thereby realizing a normal level transfer function. If the electrical potential at the Q point is released, the thin film transistor NT9 is turned off to cause the GOA function to fail.

In comparison with prior art, the single-type gate driver circuit and the liquid crystal panel of the embodiments of the disclosure realize a driving method that scans the gates of pixel arrays row by row. The embodiments of the disclosure enhance stability of the single-type gate driver circuit when the display device is displaying reloaded images by the synchronization module. The embodiments of the disclosure prevent the stability of the gate driver circuit from being interfered by the display area and reduce risks of reloading failure of the gate driver circuit by means of synchronizing the disturbance of the down to up terminal with the low electrical potential line or synchronizing the disturbance of the up to down terminal with the low electrical potential line.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A gate driver circuit for a liquid crystal panel, comprising:
 a plurality of shift registers, wherein each of the plurality of shift registers comprises:
 a forward/reverse switching module;

a low electrical potential line; and a synchronization module, wherein the forward/reverse switching module comprises an up to down terminal and a down to up terminal;

the forward/reverse switching module is configured to control a scan order of the plurality of shift registers by a signal from the up to down terminal and a signal from the down to up terminal; and the synchronization module is configured to electrically conduct the low electrical potential line with one of the up to down terminal and the down to up terminal which has a lower electrical potential, and the synchronization module comprises a first thin film transistor and a second thin film transistor, wherein a gate of the first thin film transistor is electrically connected to the up to down terminal;

a source of the first thin film transistor is electrically connected to the low electrical potential line;

a drain of the first thin film transistor is electrically connected to the down to up terminal;

a gate of the second thin film transistor is electrically connected to the down to up terminal;

a source of the second thin film transistor is electrically connected to the up to down terminal; and a drain of the second thin film transistor is electrically connected to the low electrical potential line, wherein each of the plurality of shift registers further comprises:

a gate signal terminal;
a pull-up module;
a pull-up switch;
a pull-down module; and
a pull-down switch;

wherein the pull-up module is configured to receive a gate signal from a previous shift register and to produce a pull-up signal;

the pull-up switch is electrically connected to the pull-up module and the gate signal terminal and is configured to receive the pull-up signal and a clock signal, and is configured to transmit the clock signal to the gate signal terminal according to the pull-up signal;

the pull-down module is configured to receive a gate signal from a next shift register and to produce a pull-down signal;

the pull-down switch is electrically connected to the pull-down module, the gate signal terminal, and the low electrical potential line, and is configured to receive the pull-down signal and to electrically conduct the gate signal terminal and the low electrical potential line according to the pull-down signal; and the forward/reverse switching module is electrically connected to the pull-up module and the pull-down module, and is configured to control the pull-up module and the pull-down module according to the signal from the up to down terminal and the signal from the down to up terminal.

2. The gate driver circuit according to claim 1, further comprising an all gate off module electrically connected to the gate signal terminal and the low electrical potential line.

3. The gate driver circuit according to claim 1, further comprising an all gate on module electrically connected to the gate signal terminal, the pull-down switch, and the low electrical potential line.

4. The gate driver circuit according to claim 1, wherein the gate driver circuit for the liquid crystal panel is a gate driver on array (GOA) circuit.

5. The gate driver circuit according to claim 1, wherein the first thin film transistor and the second thin film transistor are both N-channel metal oxide semiconductors (NMOSs).

6. A gate driver circuit for a liquid crystal panel, comprising: a plurality of shift registers, wherein each of the plurality of shift registers comprises:

a forward/reverse switching module;
a low electrical potential line; and
a synchronization module, wherein the forward/reverse switching module comprises an up to down terminal and a down to up terminal;

the forward/reverse switching module is configured to control a scan order of the plurality of shift registers by a signal from the up to down terminal and a signal from the down to up terminal; and the synchronization module is configured to electrically conduct the low electrical potential line with one of the up to down terminal and the down to up terminal which has a lower electrical potential, and the synchronization module comprises a first thin film transistor and a second thin film transistor, wherein a gate of the first thin film transistor is electrically connected to the up to down terminal;

a source of the first thin film transistor is electrically connected to the low electrical potential line;

a drain of the first thin film transistor is electrically connected to the down to up terminal;

a gate of the second thin film transistor is electrically connected to the down to up terminal;

a source of the second thin film transistor is electrically connected to the up to down terminal; and a drain of the second thin film transistor is electrically connected to the low electrical potential line.

7. The gate driver circuit according to claim 6, wherein each of the plurality of shift registers further comprises:

a gate signal terminal;
a pull-up module;
a pull-up switch;
a pull-down module; and
a pull-down switch, wherein the pull-up module is configured to receive a gate signal from a previous shift register and to produce a pull-up signal;

the pull-up switch is electrically connected to the pull-up module and the gate signal terminal, and is configured to receive the pull-up signal and a clock signal and to transmit the clock signal to the gate signal terminal according to the pull-up signal;

the pull-down module is configured to receive a gate signal from a next shift register and to produce a pull-down signal;

the pull-down switch is electrically connected to the pull-down module, the gate signal terminal, and the low electrical potential line, and is configured to receive the pull-down signal and to electrically conduct the gate signal terminal and the low electrical potential line according to the pull-down signal; and the forward/reverse switching module is electrically connected to the pull-up module and the pull-down module, and is configured to control the pull-up module and the pull-down module according to the signal from the up to down terminal and the signal from the down to up terminal.

8. The gate driver circuit according to claim 6, further comprising an all gate off module electrically connected to the gate signal terminal, and the low electrical potential line.

9. The gate driver circuit according to claim 6, further comprising an all gate on module electrically connected to the gate signal terminal, the pull-down switch, and the low electrical potential line.

10. The gate driver circuit according to claim 6, wherein the gate driver circuit for the liquid crystal panel is a GOA circuit.

11. The gate driver circuit according to claim 6, wherein the first thin film transistor and the second thin film transistor are both N-channel MOSs.

12. A liquid crystal panel, comprising:
a substrate;
a pixel array;
a gate driver circuit; and
a clock signal producer, wherein all of the pixel array, the gate driver circuit, and the clock signal producer are disposed on the substrate;
the gate driver circuit is configured to drive the pixel array; and
the clock signal producer is configured to produce a clock signal to the gate driver circuit, wherein the gate driver circuit comprising a plurality of shift registers, wherein each of the plurality of shift registers comprises:
a forward/reverse switching module;
a low electrical potential line; and
a synchronization module, wherein the forward/reverse switching module comprises an up to down terminal and a down to up terminal;
the forward/reverse switching module is configured to control a scan order of the plurality of shift registers by a signal from the up to down terminal and a signal from the down to up terminal; and
the synchronization module is configured to electrically conduct the low electrical potential line with one of the up to down terminal and the down to up terminal which has a lower electrical potential and the synchronization module comprises a first thin film transistor and a second thin film transistor, wherein a gate of the first thin film transistor is electrically connected to the up to down terminal;
a source of the first thin film transistor is electrically connected to the low electrical potential line;
a drain of the first thin film transistor is electrically connected to the down to up terminal, a gate of the second thin film transistor is electrically connected to the down to up terminal;
a source of the second thin film transistor is electrically connected to the up to down terminal; and
a drain of the second thin film transistor is electrically connected to the low electrical potential line.

13. The liquid crystal panel according to claim 12, wherein each of the plurality of shift registers further comprises:
a gate signal terminal;
a pull-up module;
a pull-up switch;
a pull-down module; and
a pull-down switch, wherein the pull-up module is configured to receive a gate signal from a previous shift register and to produce a pull-up signal;
the pull-up switch is electrically connected to the pull-up module and the gate signal terminal and is configured to receive the pull-up signal and a clock signal and configured to transmit the clock signal to the gate signal terminal according to the pull-up signal;
the pull-down module is configured to receive a gate signal from a next shift register and to produce a pull-down signal;
the pull-down switch is electrically connected to the pull-down module, the gate signal terminal, and the low electrical potential line and is configured to receive the pull-down signal and configured to electrically conduct the gate signal terminal and the low electrical potential line according to the pull-down signal; and
the forward/reverse switching module is electrically connected to the pull-up module and the pull-down module and is configured to control the pull-up module and the pull-down module according to a signal from the up to down terminal and a signal from the down to up terminal.

14. The gate driver circuit according to claim 12, further comprising an all gate off module electrically connected to the gate signal terminal, and the low electrical potential line.

15. The gate driver circuit according to claim 14, further comprising an all gate on module electrically connected to the gate signal terminal, the pull-down switch, and the low electrical potential line.

16. The gate driver circuit according to claim 12, wherein the gate driver circuit for the liquid crystal panel is a GOA circuit.

17. The gate driver circuit according to claim 12, wherein the first thin film transistor and the second thin film transistor are both N-channel MOSs.

* * * * *